United States Patent
Ko et al.

(10) Patent No.: US 12,356,821 B2
(45) Date of Patent: Jul. 8, 2025

(54) DISPLAY DEVICE WITH EMISSION REGION HAVING MULTIPLE EMISSION LAYERS

(71) Applicant: Samsung Display Co., Ltd., Yongin-si (KR)

(72) Inventors: Hyomin Ko, Suwon-si (KR); Beomjoon Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 245 days.

(21) Appl. No.: 17/204,255

(22) Filed: Mar. 17, 2021

(65) Prior Publication Data

US 2022/0045296 A1 Feb. 10, 2022

(30) Foreign Application Priority Data

Aug. 6, 2020 (KR) .......................... 10-2020-0098787

(51) Int. Cl.
*H01L 51/50* (2006.01)
*H01L 27/32* (2006.01)
(Continued)

(52) U.S. Cl.
CPC ............. *H10K 59/35* (2023.02); *H10K 50/15* (2023.02); *H10K 50/16* (2023.02); *H10K 50/171* (2023.02); *H10K 50/818* (2023.02); *H10K 59/122* (2023.02); *H10K 59/12* (2023.02); *H10K 59/80518* (2023.02); *H10K 59/87* (2023.02); *H10K 59/873* (2023.02); *H10K 59/876* (2023.02)

(58) Field of Classification Search
CPC ............ H01L 51/5072; H01L 27/3246; H01L 51/5056; H01L 51/5092; H01L 51/5218
See application file for complete search history.

(56) References Cited

U.S. PATENT DOCUMENTS 7,649,197 B2  1/2010  Iwaki et al.
7,719,180 B2  5/2010  Spindler et al.
(Continued)

FOREIGN PATENT DOCUMENTS

KR       20050067057 A  *  6/2005
KR       10-2007-0058765     6/2007
(Continued)

*Primary Examiner* — Peter Bradford
(74) *Attorney, Agent, or Firm* — KILE PARK REED & HOUTTEMAN PLLC

(57) ABSTRACT

A display device includes a base layer including first and second emission regions, first and second electrodes, a first organic layer in the first emission region, and a second organic layer in the second emission region. The first organic layer includes a first electron transport layer, a first auxiliary layer on the first electron transport layer, a first emission layer on the first auxiliary layer, a second auxiliary layer on the first emission layer, and a first hole transport layer on the second auxiliary layer. The second organic layer includes a second electron transport layer, a third auxiliary layer on the second electron transport layer, a second emission layer on the third auxiliary layer, a fourth auxiliary layer on the second emission layer, and a second hole transport layer on the fourth auxiliary layer.

12 Claims, 10 Drawing Sheets

(51) Int. Cl.
  H01L 51/52   (2006.01)
  H10K 50/15   (2023.01)
  H10K 50/16   (2023.01)
  H10K 50/17   (2023.01)
  H10K 50/818  (2023.01)
  H10K 59/122  (2023.01)
  H10K 59/35   (2023.01)
  H10K 59/12   (2023.01)
  H10K 59/80   (2023.01)

(56) References Cited

U.S. PATENT DOCUMENTS

| | | | |
|---|---|---|---|
| 9,142,795 B2 | 9/2015 | Kim et al. | |
| 2006/0001363 A1* | 1/2006 | Park | H10K 59/131 |
| | | | 313/504 |
| 2009/0309093 A1* | 12/2009 | Iwaki | C09K 11/06 |
| | | | 313/504 |
| 2013/0043498 A1* | 2/2013 | Pyo | H10K 50/166 |
| | | | 257/89 |
| 2015/0008819 A1* | 1/2015 | Yu | H10K 50/841 |
| | | | 313/504 |
| 2015/0163866 A1* | 6/2015 | Chan | H05B 33/10 |
| | | | 445/25 |
| 2016/0218154 A1* | 7/2016 | Pyo | H01L 51/5088 |
| 2016/0329383 A1 | 11/2016 | Li et al. | |
| 2018/0090716 A1* | 3/2018 | Shirahase | H10K 50/852 |
| 2019/0198573 A1* | 6/2019 | Kim | H10K 59/38 |
| 2019/0393439 A1* | 12/2019 | Jankus | H10K 50/165 |
| 2020/0127237 A1* | 4/2020 | Ju | H01L 51/5275 |

FOREIGN PATENT DOCUMENTS

| | | |
|---|---|---|
| KR | 10-2011-0058749 | 6/2011 |
| KR | 10-1246284 | 3/2013 |
| KR | 10-1952899 | 2/2019 |
| KR | 10-2077141 | 2/2020 |

* cited by examiner

DISPLAY DEVICE WITH EMISSION REGION HAVING MULTIPLE EMISSION LAYERS

CROSS-REFERENCE TO RELATED APPLICATION(S)

This application claims priority to and benefits of Korean Patent Application No. 10-2020-0098787 under 35 U.S.C. § 119, filed on Aug. 6, 2020 in the Korean Intellectual Property Office, the entire contents of which are hereby incorporated by reference.

BACKGROUND

The disclosure relates to a display device, and more particularly, to a display device having an inverted element structure with improved efficiency.

Various types of display devices used for multimedia devices such as a television set, a mobile phone, a tablet computer, a navigation system, and a game console have been developed and are under development. In the display devices, a self-luminescent display element is used. The self-luminescent display element emits light by use of organic compound-containing light emitting material.

A display device is provided with a light emitting element and a thin film transistor that drives the light emitting element. The thin film transistor may be a PMOS transistor or an NMOS transistor based on charge carriers or doping impurities. Since a PMOS transistor has a hole as a carrier while an NMOS transistor has an electron as a carrier, an NMOS transistor has faster mobility than a PMOS transistor, and thus an NMOS transistor is advantageous for a high-speed driving.

In a light emitting element, as a current flows for a long time, the threshold voltage is changed. In an NMOS transistor, since an organic light emitting element is located in a source side of the thin film transistor, the voltage on the source side of the thin film transistor is changed when the threshold voltage of the organic light emitting element is deteriorated. As a result, even though the same data voltage is applied to a gate of the thin film transistor, the voltage between the gate and the source of the thin film transistor is changed, and thus a non-uniform current flows in the organic light emitting element. Application of an inverted element structure is necessitated and desired to implement such a circuit that the deterioration of the light emitting element does not affect the performance of an NMOS driving circuit.

SUMMARY

The disclosure provides a display device having an inverted element structure capable of being applied to a circuit layer including an NMOS transistor.

The disclosure also provides a light emitting element in which an auxiliary layer is disposed to be adjacent to an emission layer in the inverted element structure, thereby improving luminous efficiency, and a display device including the same.

An embodiment of the disclosure provides a display device that may include a base layer including a first emission region and a second emission region; a first electrode disposed on the base layer; a second electrode disposed on the first electrode and facing the first electrode; a first organic layer disposed between the first electrode and the second electrode and disposed on the first emission region; and a second organic layer disposed between the first electrode and the second electrode and disposed on the second emission region. The first organic layer may include a first electron transport layer disposed on the first electrode, a first auxiliary layer disposed on the first electron transport layer, a first emission layer disposed on the first auxiliary layer and emitting first light, a second auxiliary layer disposed on the first emission layer, and a first hole transport layer disposed on the second auxiliary layer. The second organic layer may include a second electron transport layer disposed on the first electrode, a third auxiliary layer disposed on the second electron transport layer, a second emission layer disposed on the third auxiliary layer and emitting second light having a wavelength different from a wavelength of the first light, a fourth auxiliary layer disposed on the second emission layer, and a second hole transport layer disposed on the fourth auxiliary layer.

In an embodiment, a thickness of the first organic layer may be in a range of about 250 nm to about 290 nm, and a thickness of the second organic layer may be in a range of about 210 nm to about 250 nm.

In an embodiment, a thickness of the first auxiliary layer and a thickness of the third auxiliary layer may be different from each other.

In an embodiment, a thickness of the second auxiliary layer and a thickness of the fourth auxiliary layer may be different from each other.

In an embodiment, the first auxiliary layer and the third auxiliary layer may include an electron transporting material, and the second auxiliary layer and the fourth auxiliary layer may include a hole transporting material.

In an embodiment, the first electrode may be a reflective electrode, the second electrode may be a transflective electrode or a transmissive electrode, and the first light and the second light may be emitted in a direction from the first electrode to the second electrode.

In an embodiment, the display device may further include a circuit layer disposed on the base layer and including a transistor electrically connected to the first electrode.

In an embodiment, the transistor may be an NMOS transistor.

In an embodiment, the wavelength of the first light may be in a range of about 625 nm to about 675 nm, and the wavelength of the second light may be in a range of about 500 nm to about 570 nm.

In an embodiment, the first organic layer may include a first electron injection layer disposed between the first electrode and the first electron transport layer, and the second organic layer may include a second electron injection layer disposed between the first electrode and the second electron transport layer.

In an embodiment, the first organic layer may include a first hole injection layer disposed between the second electrode and the first hole transport layer, and the second organic layer may include a second hole injection layer disposed between the second electrode and the second hole transport layer.

In an embodiment, the display device may further include a third organic layer disposed between the first electrode and the second electrode and disposed on a third emission region in the base layer. The third organic layer may include a third electron transport layer disposed on the first electrode; a third emission layer disposed on the third electron transport layer and emitting third light; and a third hole transport layer disposed on the third emission layer, and the thickness of the third organic layer may be in a range of about 160 nm to about 200 nm.

In an embodiment, a wavelength of the third light may be in a range of about 410 nm to about 480 nm.

In an embodiment, the display device may further include a capping layer disposed on the second electrode, wherein the capping layer may have a refractive index of about 1.6 or more.

In an embodiment, the first electron transport layer and the second electron transport layer may be integral each other, and the first hole transport layer and the second hole transport layer may be integral each other.

In an embodiment, the display device may further include a pixel defining film disposed on the base layer. Opening may be defined in the pixel defining film corresponding to the first emission region and the second emission region. At least a portion of each of the first electron transport layer, the second electron transport layer, the first hole transport layer, and the second hole transport layer may be disposed on the pixel defining film.

In an embodiment, a first opening corresponding to the first emission region and a second opening corresponding to the second emission region may be defined in the pixel defining film, the first auxiliary layer, the first emission layer, and the second auxiliary layer may be disposed in the first opening, and the third auxiliary layer, the second emission layer, and the fourth auxiliary layer may be disposed in the second opening.

In an embodiment, a display device may include a base layer including a first emission region and a second emission region; a circuit layer disposed on the base layer and including a plurality of transistors; a first electrode disposed on the circuit layer; an electron injection layer disposed on the first electrode; an electron transport layer disposed on the electron injection layer; a first emission layer disposed on the electron transport layer, overlapping the first emission region, and emitting first light; a second emission layer disposed on the electron transport layer, overlapping the second emission region, and emitting second light having an emission wavelength different from an emission wavelength of the first light; a hole transport layer disposed on the first emission layer and the second emission layer; a hole injection layer disposed on the hole transport layer; a second electrode disposed on the hole injection layer; a first auxiliary layer disposed between the electron transport layer and the first emission layer; a second auxiliary layer disposed between the hole transport layer and the first emission layer; a third auxiliary layer disposed between the electron transport layer and the second emission layer; and a fourth auxiliary layer disposed between the hole transport layer and the second emission layer.

In an embodiment, the first electrode may be a reflective electrode, the second electrode may be a transflective electrode or a transmissive electrode, and the first light and the second light may be emitted in a direction from the first electrode to the second electrode.

In an embodiment, at least one of the plurality of transistors may be an NMOS transistor, and the first electrode may be electrically connected to the NMOS transistor.

BRIEF DESCRIPTION OF THE DRAWINGS

The accompanying drawings are included to provide a further understanding of the invention, and are incorporated in and constitute a part of this specification. The drawings illustrate embodiments of the disclosure and, together with the description, serve to explain principles of the invention. In the drawings.

DETAILED DESCRIPTION OF THE EMBODIMENTS

Figure 1:
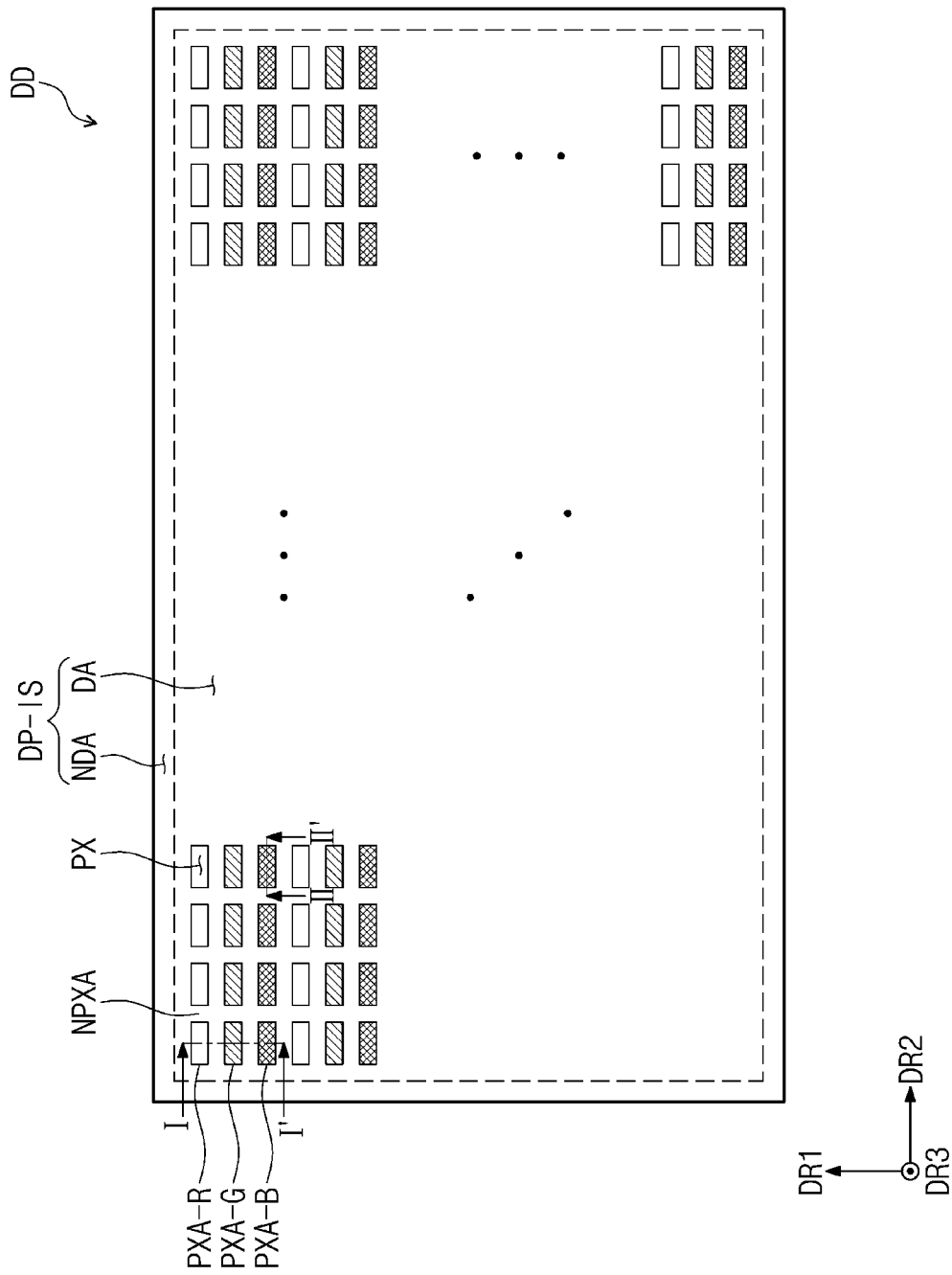
FIG. 1 is a plan view of a display device according to an embodiment.

The embodiments may be modified in many alternate forms. The embodiments are disclosed in the description with reference to the drawings. It should be understood, however, that it is not intended to limit the disclosure to the particular forms disclosed, but rather, is intended to cover all modifications, equivalents, and alternatives falling within the spirit and scope of the invention.

In the specification, when an element (or a region, a layer, a portion, etc.) is referred to as being "on," "connected to," or "coupled to" another element, it means that the element may be directly connected to or coupled to the other element, or that a third element may be disposed therebetween. Also, when an element is referred to as being "in contact" or "contacted" or the like to another element, the element may be in "electrical contact" or in "physical contact" with another element; or in "indirect contact" or in "direct contact" with another element.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Like reference numerals refer to like elements. Also, in the drawings, the thickness, the ratio, and the dimensions of elements are exaggerated for an effective description of technical contents.

It will be understood that, although the terms "first," "second," etc. may be used herein to describe various elements, these elements should not be limited by these terms. These terms are only used to distinguish one element from another. For example, a first element may be referred to as a second element, and, similarly, the second element may be referred to as the first element, without departing from the scope of the invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a display device according to an embodiment will be described with reference to the accompanying drawings.

Figure 2:
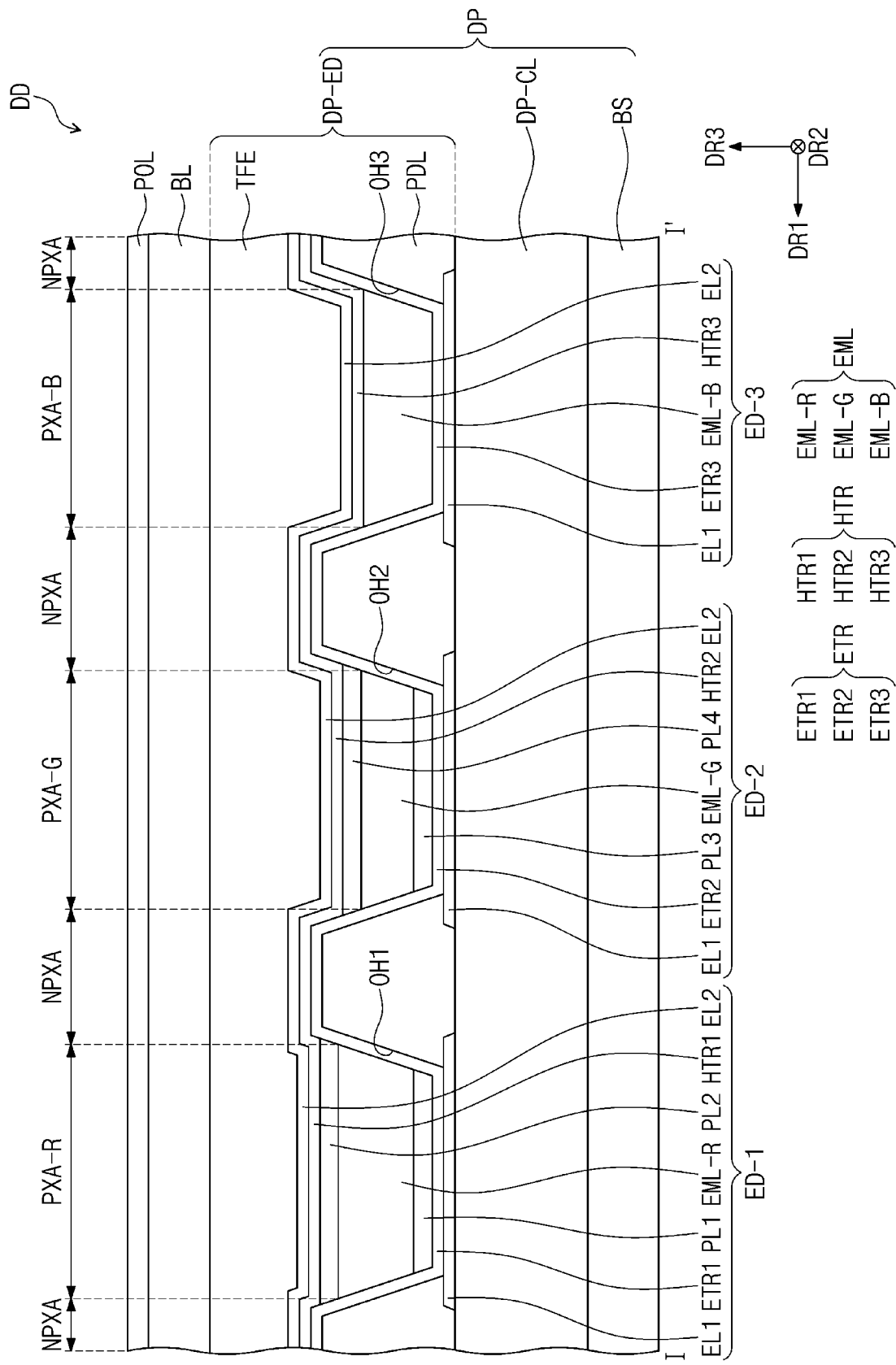
FIG. 2 is a cross-sectional view of a display device according to an embodiment.

FIG. 1 is a schematic plan view of a display device DD according to an embodiment. FIG. 2 is a cross-sectional view of the display device DD shown in FIG. 1.

As shown in FIG. 1, the display device DD may display an image through a display surface DP-IS. The display surface DP-IS may be parallel to a plane defined by a first direction DR1 and a second direction DR2. The display surface DP-IS may include a display region DA and a non-display region NDA. Pixels PX are disposed on the display region DA. The non-display region NDA is defined along edges of the display surface DP-IS. The non-display region NDA is adjacent to the display region DA. The non-display region NDA may surround the display region DA.

A normal direction of the display surface DP-IS, i.e., a thickness direction of the display device DD corresponds to a third direction DR3. A front surface (or an upper surface) and a rear surface (or a lower surface) of each of layers or units described below are distinguished by the third direction DR3. The front and rear surfaces may be opposite to each other in the third direction DR3. Third directions DR1, DR2 and DR3 may be relative directions and may be defined differently. In an embodiment, the display device DD having a flat display surface DP-IS is illustrated, but the embodiments are not limited thereto. The display device DD may include a curved display surface or a three-dimensional display surface. The three-dimensional display surface may include display regions facing different directions.

FIG. 2 illustrates a schematic cross-section of the display device DD, taken along line I-I' of FIG. 1. The display device DD of an embodiment includes light emitting elements ED-1, ED-2, and ED-3. At least one of the light emitting elements ED-1, ED-2, and ED-3 may include auxiliary layers PL1, PL2, PL3, and PL4. As an example in FIG. 2, the first light emitting element ED-1 includes a first auxiliary layer PL1 and a second auxiliary layer PL2, and the second light emitting element ED-2 includes a third auxiliary layer PL3 and a fourth auxiliary layer PL4. While FIG. 2 illustrates that the third light emitting element ED-3 does not include the auxiliary layer, the third light emitting element ED-3 may also include the auxiliary layer.

A display panel DP of the display device DD according to an embodiment may include a base layer BS, a circuit layer DP-CL disposed on the base layer BS, and a display element layer DP-ED disposed on the circuit layer DP-CL. The base layer BS may provide a base surface on which the display element layer DP-ED is disposed. The base layer BS may be a glass substrate, a metal substrate, a plastic substrate, or the like. However, the embodiments are not limited thereto.

In an embodiment, the circuit layer DP-CL may be disposed on the base layer BS. The circuit layer DP-CL may include transistors (not shown). Each of the transistors (not shown) may include a control electrode, an input electrode, and an output electrode. For example, the circuit layer DP-CL may include a switching transistor and a driving transistor in order to drive light emitting elements ED-1, ED-2, and ED-3 of the display element layer DP-ED.

The display element layer DP-ED of an embodiment may include a pixel defining film PDL, the light emitting elements ED-1, ED-2, and ED-3 separated by the pixel defining film PDL, and an encapsulation layer TFE disposed on the light emitting elements ED-1, ED-2, and ED-3.

Each of the light emitting elements ED-1, ED-2, and ED-3 may include a first electrode EL1, a second electrode EL2 facing the first electrode EL1, and an emission layer EML disposed between the first electrode EL1 and the second electrode EL2. An electron transport region ETR is disposed between the first electrode EL1 and the emission layer EML. A hole transport region HTR is disposed between the second electrode EL2 and the emission layer EML. In an embodiment, the light emitting elements ED-1, ED-2, and ED-3 may emit light from the first electrode EL1 to the second electrode EL2. The light emitting elements ED-1, ED-2, and ED-3 of an embodiment may have an inverted element structure in which the electron transport region ETR is disposed below the emission layer EML and the hole transport region HTR is disposed above the emission layer EML, along a direction in which light is emitted.

The light emitting elements ED-1 and ED-2 include the auxiliary layers PL1, PL2, PL3, and PL4. The first auxiliary layer PL1 is disposed between the first electron transport region ETR1 and the first emission layer EML-R of the first light emitting element ED-1. The second auxiliary layer PL2 is disposed between the first hole transport region HTR1 and the first emission layer EML-R of the first light emitting element ED-1. The third auxiliary layer PL3 is disposed between the second electron transport region ETR2 and the second emission layer EML-G of the second light emitting element ED-2. The fourth auxiliary layer PL4 is disposed between the second hole transport region HTR2 and the second emission layer EML-G of the second light emitting element ED-2.

FIG. 2 illustrates that all the thicknesses of the first to fourth auxiliary layers PL1, PL2, PL3, and PL4 are similar, but the embodiments are not limited thereto. For example, the thickness of at least one of the auxiliary layers PL1, PL2, PL3, and PL4 may be different from that of others, or the thickness of the auxiliary layers PL1, PL2, PL3, and PL4 may be different each other according to the positions of the first emission layer EML-R and the second emission layer EML-G. The thicknesses of the first to fourth auxiliary layers PL1, PL2, PL3, and PL4 may be a thickness when viewed in a plane defined by the third direction DR3 or measured in the third direction DR3.

FIG. 2 illustrates an embodiment in which the emission layers EML-R, EML-G, and EML-B of the light emitting elements ED-1, ED-2, and ED-3 are disposed in the openings OH1, OH2, and OH3 defined by the pixel defining film PDL, and the first to third electron transport regions ETR1, ETR2, and ETR3, the first to third hole transport regions HTR1, HTR2, and HTR3 and the second electrode EL2 is provided as a common layer in the entire light emitting elements ED-1, ED-2, and ED-3. For example, at least a portion of each of the first electron transport region ETR1 of the first light emitting element ED-1, the second electron transport region ETR2 of the second light emitting element ED-2, and the third electron transport region ETR3 of the third light emitting element ED-3 may be disposed on the pixel defining film PDL, and the first electron transport region ETR1, the second electron transport region ETR2, and the third electron transport region ETR3 each may be connected to each other on the pixel defining film PDL to be integral with each other. In addition, at least a portion of each of the first hole transport region HTR1 of the first light emitting element ED-1, the second hole transport region HTR2 of the second light emitting element ED-2, and the third hole transport region HTR3 of the third light emitting element ED-3 may be disposed on the pixel defining film PDL, and the first hole transport region HTR1, the second hole transport region HTR2, and the third hole transport region HTR3 each may be connected to each other on the pixel defining film PDL to be integral with each other.

However, the embodiments are not limited thereto, and unlike the feature illustrated in FIG. 2, the electron transport region ETR and the hole transport region HTR may be provided by being patterned inside the opening holes OH1, OH2, and OH3 defined in the pixel defining film PDL. For example, the first to third electron transport regions ETR1, ETR2, and ETR3, the emission layers EML-R, EML-G, and EML-B, and the first to third hole transport regions HTR1, HTR2, and HTR3 of the light emitting elements ED-1, ED-2, and ED-3 are patterned by an inkjet printing method to be provided inside each of the first to third openings OH1, OH2, and OH3.

In an embodiment, for the first light emitting element ED-1, the first auxiliary layer PL1, the first emission layer EML-R, and the second auxiliary layer PL2 may be disposed in the first opening OH1. For the second light emitting element ED-2, the third auxiliary layer PL3, the second emission layer EML-G, and the fourth auxiliary layer PL4 may be disposed in the second opening OH2. For the third light emitting element ED-3, the third emission layer EML-B may be disposed in the third opening OH3. If the auxiliary layer adjacent to the third emission layer EML-B is provided for the third light emitting element ED-3, the auxiliary layer of the third light emitting element ED-3 may also be disposed in the third opening OH3.

The encapsulation layer TFE may cover the light emitting elements ED-1, ED-2 and ED-3. The encapsulation layer TFE may seal the display element layer DP-ED. The encapsulation layer TFE may be a thin film encapsulation layer. The encapsulation layer TFE may a single layer or lamination of layers. The encapsulation layer TFE may include at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film protects the display element layer DP-ED from moisture and/or oxygen, and the encapsulation-organic film protects the display element layer DP-ED from foreign substances such as dust particles. The encapsulation-inorganic film may include silicon nitride, silicon oxynitride, silicon oxide, titanium oxide, aluminum oxide, or the like, but the embodiments are not particularly limited thereto. The encapsulation-organic film may include an acrylic-based compound, an epoxy-based compound, or the like. The encapsulation-organic film may include a photopolymerizable organic material, but the embodiments are not particularly limited thereto.

The encapsulation layer TFE may be disposed on the second electrode EL2 and may be disposed to fill the openings OH1, OH2, and OH3.

Referring to FIGS. 1 and 2, the display device DD may include a non-light emitting region NPXA and light emitting regions PXA-R, PXA-G and PXA-B. Each of the light emitting regions PXA-R, PXA-G and PXA-B may be a region where light generated from each of the light emitting elements ED-1 is emitted, ED-2 and ED-3. The plurality of light emitting regions PXA-R, PXA-G, and PXA-B may be spaced apart from each other in a plane.

Each of the light emitting regions PXA-R, PXA-G, and PXA-B may be a region divided by the pixel defining film PDL. The non-light emitting regions NPXA may be regions between the adjacent light emitting regions PXA-R, PXA-G, and PXA-B, and may correspond to the pixel defining film PDL. In the specification, each of the light emitting regions PXA-R, PXA-G, and PXA-B may correspond to a pixel PX. The pixel defining film PDL may separate the light emitting elements ED-1, ED-2 and ED-3. The plurality of emission layers EML-R, EML-G and EML-B of the light emitting elements ED-1, ED-2 and ED-3 may be disposed in openings OH1, OH2, and OH3 defined by the pixel defining film PDL to be separated each other.

The light emitting regions PXA-R, PXA-G and PXA-B may be divided into groups according to the color of light generated from the light emitting elements ED-1, ED-2 and ED-3. In the display device DD of an embodiment shown in FIGS. 1 and 2, three light emitting regions PXA-R, PXA-G, and PXA-B which respectively emit red light, green light, and blue light are illustrated. For example, the display device DD of an embodiment may include a red light emitting region PXA-R, a green light emitting region PXA-G, and a blue light emitting region PXA-B which are distinguished from each other.

In the display device DD according to an embodiment, the light emitting elements ED-1, ED-2 and ED-3 may emit light in different wavelength band. For example, in an embodiment, the display device DD may include the first light emitting element ED-1 that emits red light, the second light emitting element ED-2 that emits green light, and the third light emitting element ED-3 that emits blue light. For example, the red light emitting region PXA-R, the green light emitting region PXA-G, and the blue light emitting region PXA-B of the display device DD may correspond to the first light emitting element ED-1, the second light emitting element ED-2, and the third light emitting element ED-3, respectively.

The plurality of light emitting regions PXA-R, PXA-G, and PXA-B in the display device DD according to an embodiment may be arranged in a stripe form. Referring to FIG. 1, the red light emitting regions PXA-R, the green light emitting regions PXA-G, and the blue light emitting regions PXA-B each may be arranged along the second direction DR2. The red light emitting region PXA-R, the green light emitting region PXA-G, and the blue light emitting region PXA-B may be alternately arranged along the first direction DR1.

FIGS. 1 and 2 illustrate that all the light emitting regions PXA-R, PXA-G, and PXA-B have similar area, but the embodiments are not limited thereto. For example, the light emitting regions PXA-R, PXA-G, and PXA-B may have different areas from each other according to a wavelength range of the emitted light. The areas of the light emitting regions PXA-R, PXA-G, and PXA-B may mean areas when viewed in a plane defined by the first direction DR1 and the second direction DR2.

The arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to the display quality required in the display device DD. For example, the arrangement form of light emitting regions PXA-R, PXA-G, and PXA-B may be a PenTile® arrangement form or a diamond arrangement form.

The display device DD of an embodiment may include a base substrate BL disposed on the display panel DP. However, the embodiments are not limited thereto.

The base substrate BL may be a glass substrate, a metal substrate, a plastic substrate, etc. The base substrate BL may be a member that provides a base surface on which the polarizing layer POL or the like is disposed.

The display device DD of an embodiment may further include the polarizing layer POL. The polarizing layer POL may block external light incident to the display device DD. The polarizing layer POL may block a part of external light. The polarizing layer POL may reduce reflected light generated in the display panel DP by external light. For example, the polarizing layer POL may function to block reflected light that enters the display panel DP from the outside of the display panel DP and exits again.

FIG. 2 illustrates that the polarizing layer POL is disposed on the base substrate BL and exposed, but the embodiments are not limited thereto. For example, the polarizing layer POL may be disposed below the base substrate BL.

FIG. 2 illustrates that the display device DD includes the polarizing layer POL, but the embodiments are not limited thereto, and the polarizing layer POL may be omitted. Although not shown, in an embodiment, the display device DD may not include a polarizing layer, and may include a color filter layer. The color filter layer may include color filter parts corresponding to each of the red light emitting region PXA-R, the green light emitting region PXA-G, and the blue light emitting region PXA-B. The color filter layer may include light shielding parts overlapping the non-light emitting regions NPXA.

Figure 3:
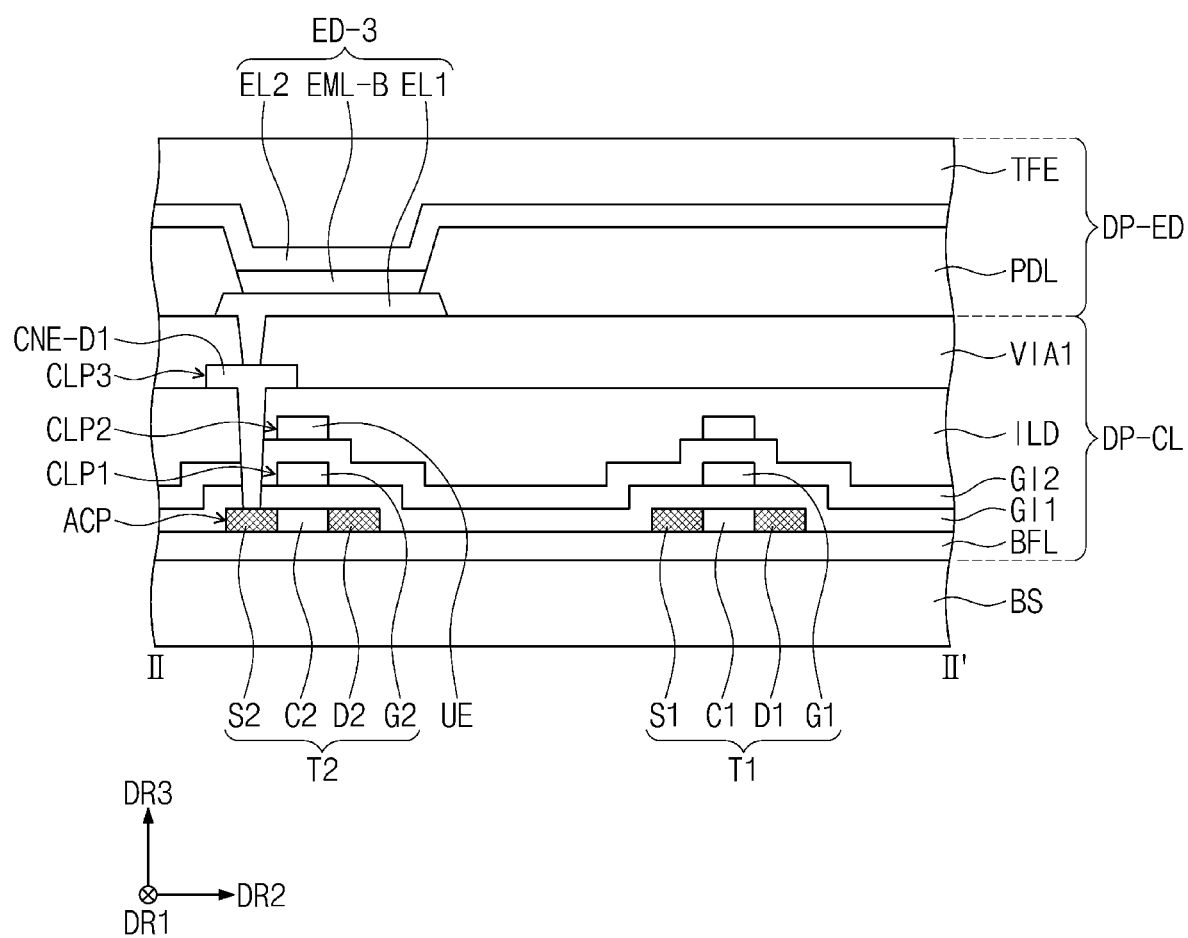
FIG. 3 is a cross-sectional view of a display device according to an embodiment.

FIG. 3 is a schematic cross-sectional view of a display device DD according to an embodiment. FIG. 3 is a schematic cross-sectional view illustrating a part taken along line II-II' of FIG. 1.

Referring to FIG. 3, the circuit layer DP-CL of the display device DD may include a buffer layer BFL, a first gate insulation layer GI1, a second gate insulation layer GI2, an interlayer insulation layer ILD, an upper insulation layer VIA1, a semiconductor pattern ACP having patterns, a first conductive layer CLP1 having patterns, a second conductive layer CLP2 having patterns, and a third conductive layer CLP3 having patterns. Here, the first conductive layer CLP1 may include a first gate metal pattern, the second conductive layer CLP2 may include a second gate metal pattern, and the third conductive layer CLP3 may include a first data metal pattern.

In an embodiment, each of the first gate insulation layer GI1, the second gate insulation layer GI2, and the interlayer insulation layer ILD includes an organic film and/or an inorganic film. In an embodiment, each of the first gate insulation layer GI1, the second gate insulation layer GI2, and the interlayer insulation layer ILD1 may include inorganic thin films. The inorganic films may include a silicon nitride layer and a silicon oxide layer. In an embodiment, each of the first conductive layer CLP1 and the second conductive layer CLP2 may include molybdenum (Mo), but the embodiments are not limited thereto.

In an embodiment, the third conductive layer CLP3 may include at least one of aluminum (Al) or titanium (Ti), but the embodiments are not limited thereto. In an embodiment, the third conductive layer CLP3 may have a structure in which titanium, aluminum, and titanium are stacked (for example, sequentially stacked).

The buffer layer BFL may be disposed on a base layer BS. The buffer layer BFL may include a first buffer layer and a second buffer layer. The second buffer layer may be disposed on the first buffer layer. The buffer layer BFL may prevent impurities present in the base layer BS from being introduced into the pixel PX. For example, the buffer layer BFL may prevent the impurities from being diffused into the semiconductor pattern ACL of transistors T1 and T2 constituting the pixel PX.

The impurities may be introduced from the outside, or may be generated while the base layer BS is thermally decomposed. The impurities may be a gas or sodium discharged from the base layer BS. The buffer layer BFL may block moisture introduced into the pixel PX from the outside.

In an embodiment, the semiconductor pattern ACP may be disposed on the buffer layer BFL.

The semiconductor pattern ACP may constitute each of the transistors T1 and T2. The semiconductor pattern ACP may include polysilicon, amorphous silicon, or a metal oxide semiconductor. FIG. 3 illustrates a semiconductor pattern constituting a source S1, an active region C1, and a drain D1 of a first transistor T1 and a semiconductor pattern constituting a source S2, an active region C2, and a drain D2 of a second transistor T2.

The first gate insulation layer GI1 is disposed on the buffer layer BFL, and may cover the semiconductor pattern ACP. The first conductive layer CLP1 may be disposed on the first gate insulation layer GI1. A gate G1 of the first transistor T1 and a gate G2 of the second transistor T2 are illustrated in the first conductive layer CLP1. Although not illustrated, in an embodiment, the first conductive layer CLP1 may include any one of two electrodes constituting a capacitor of the pixel PX.

The second gate insulation layer GI2 is disposed on the first gate insulation layer GI1, and may cover the first conductive layer CLP1. The second conductive layer CLP2 may be disposed on the second gate insulation layer GI2. In an embodiment, the second conductive layer CLP2 may be another one of the two electrodes constituting a capacitor CP of the pixel PX. An upper electrode UE is illustrated as the second conductive layer CLP2. In the upper electrode UE, an opening may be defined.

The interlayer insulation layer ILD is disposed on the second gate insulation layer GI2, and may cover the second conductive layer CLP2. First connection electrodes CNE-D1 of the third conductive layer CLP3 may be connected to the source S2 of the second transistor T2. The upper insulation layer VIA1 is disposed on the interlayer insulation layer ILD, and may cover the third conductive layer CLP3.

As shown in FIG. 3, the display element layer DP-ED may include the light emitting element ED-3 and the pixel defining film PDL. The light emitting element ED-3 may include the first electrode EL1, the emission layer EML-B, and the second electrode EL2. In FIG. 3, the first electrode EL1, the emission layer EML-B, and the second electrode EL2, which are some components of the light emitting element ED-3, are only illustrated, and the hole transport region and the electron transport region are omitted.

The first electrode EL1 may be disposed on the upper insulation layer VIAL The first electrode EL1 may be electrically connected to at least any one of the transistors T1-T2 through a contact hole. For example, the first electrode EL1 may be connected to a first connection electrode CNE-D1 through the contact hole to be electrically connected to the second transistor T2. In an embodiment, at least one of the transistors T1-T2 may be the NMOS transistor. In an embodiment, the transistor electrically connected to the first electrode EL1 may be the NMOS transistor. For example, the second transistor T2 may be the NMOS transistor.

The pixel defining film PDL may be disposed on the upper insulation layer VIA1, and may expose at least a portion of the first electrode EL1. The emission layer EML-B may be disposed on the first electrode EL1. The second electrode EL2 may be disposed on the emission layer EML-B.

In case that the light emitting element ED-3 is an organic light emitting diode (OLED), the emission layer EML-B may include an organic material. The encapsulation layer TFE may encapsulate the light emitting element ED-3 to protect the light emitting element ED-3 from external oxygen and/or moisture. The encapsulation layer TFE may be a layer in which an organic film and an inorganic film are mixed.

Hereinafter, FIGS. 4 to 13 are schematic cross-sectional views illustrating light emitting elements ED-1, ED-2, and ED-3 according to an embodiment. Hereinafter, light emitting elements according to various embodiments will be described with reference to FIGS. 4 to 13.

Figure 4:
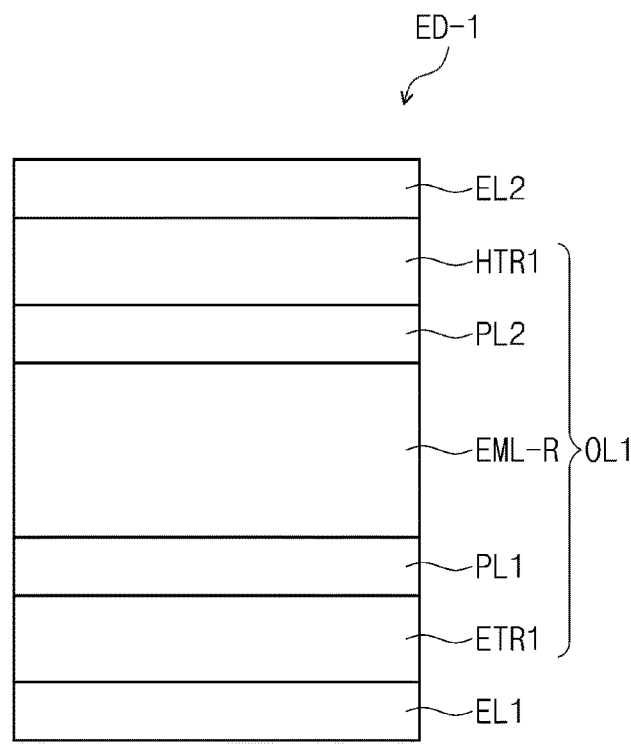
FIGS. 4 to 13 are schematic vies of light emitting elements according to embodiments.

Referring to FIG. 4, a light emitting element ED-1 according to an embodiment includes: a first electrode EU; a second electrode EL2 facing the first electrode EU; a first emission layer EML-R disposed between the first electrode EL1 and the second electrode EL2; a first electron transport region ETR1 disposed between the first electrode EL1 and the first emission layer EML-R; and a first hole transport region HTR1 disposed between the first emission layer EML-R and the second electrode EL2. A first auxiliary layer PL1 is disposed between the first electron transport region ETR1 and the first emission layer EML-R. A second auxiliary layer PL2 is disposed between the first hole transport region HTR1 and the first emission layer EML-R. The first auxiliary layer PL1 and the second auxiliary layer PL2 are disposed to contact the first emission layer EML-R.

Figure 5:
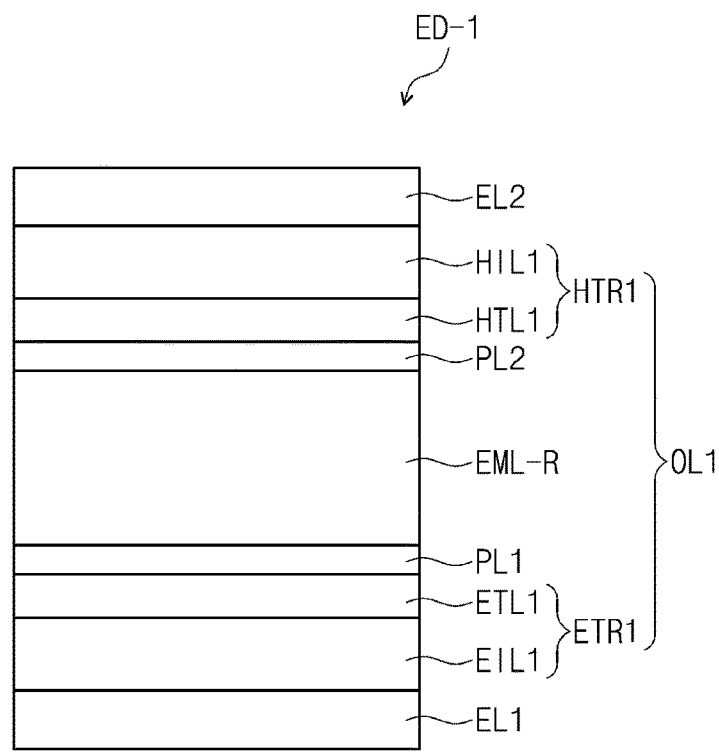
Figure 6:
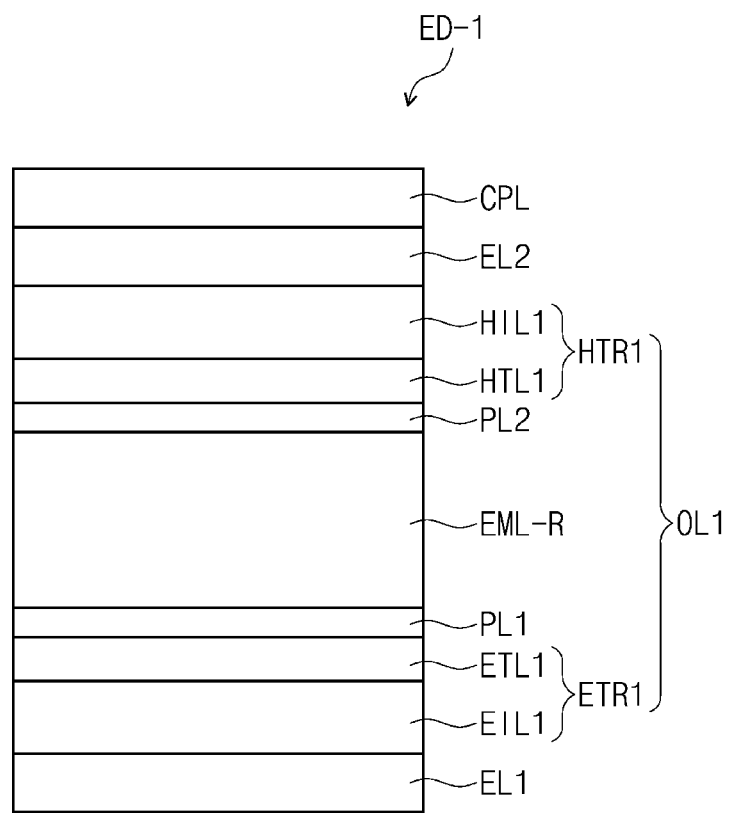

Compared to FIG. 4, FIG. 5 illustrates a schematic cross-sectional view of a light emitting element ED-1 of an embodiment in which a first electron transport region ETR1 includes a first electron injection layer EIL1 and a first electron transport layer ETL1, and a first hole transport region HTR1 includes a first hole injection layer HIL1 and a first hole transport layer HTL1. Compared to FIG. 5, FIG. 6 illustrates a schematic cross-sectional view of a light emitting element ED-1 of an embodiment further including a capping layer CPL disposed on the second electrode EL2. The embodiments are not limited thereto. For example, the first electron transport region ETR1 may further include a hole blocking layer (not shown) as a sub-organic layer, and the first hole transport region HTR1 may further include an electron blocking layer (not shown) as a sub-organic layer.

Figure 7:
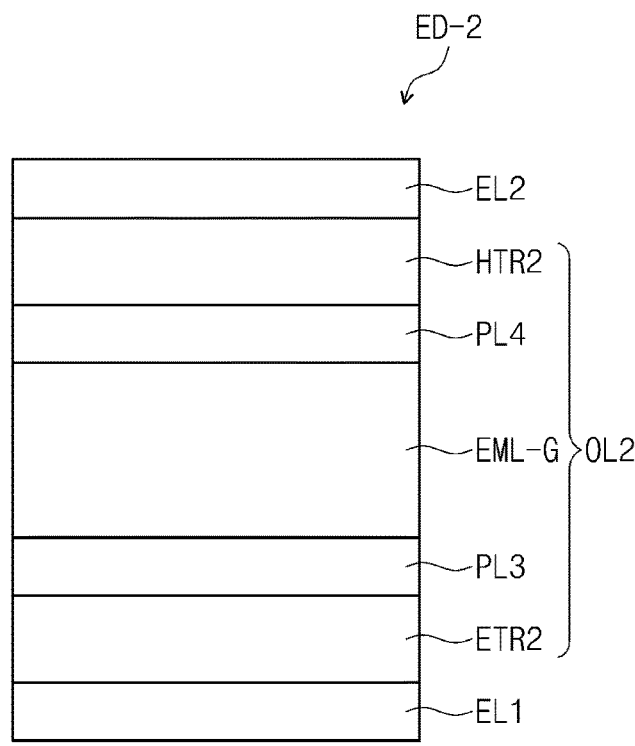

Referring to FIG. 7, a light emitting element ED-2 according to an embodiment includes: a first electrode EU; a second electrode EL2 facing the first electrode EU; a second emission layer EML-G disposed between the first electrode EL1 and the second electrode EL2; a second electron transport region ETR2 disposed between the first electrode EL1 and the second emission layer EML-G; and a second hole transport region HTR2 disposed between the second emission layer EML-G and the second electrode EL2. A third auxiliary layer PL3 is disposed between the second emission layer EML-G and the second electron transport region ETR2. A fourth auxiliary layer PL4 is disposed between the second emission layer EML-G and the second hole transport region HTR2. The third auxiliary layer PL3 and the fourth auxiliary layer PL4 are disposed to contact the second emission layer EML-G.

Figure 8:
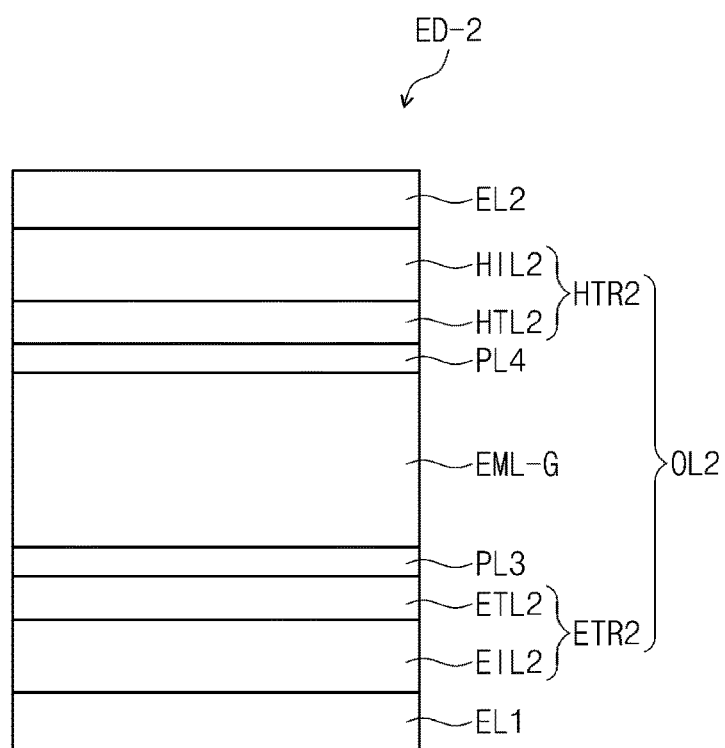
Figure 9:
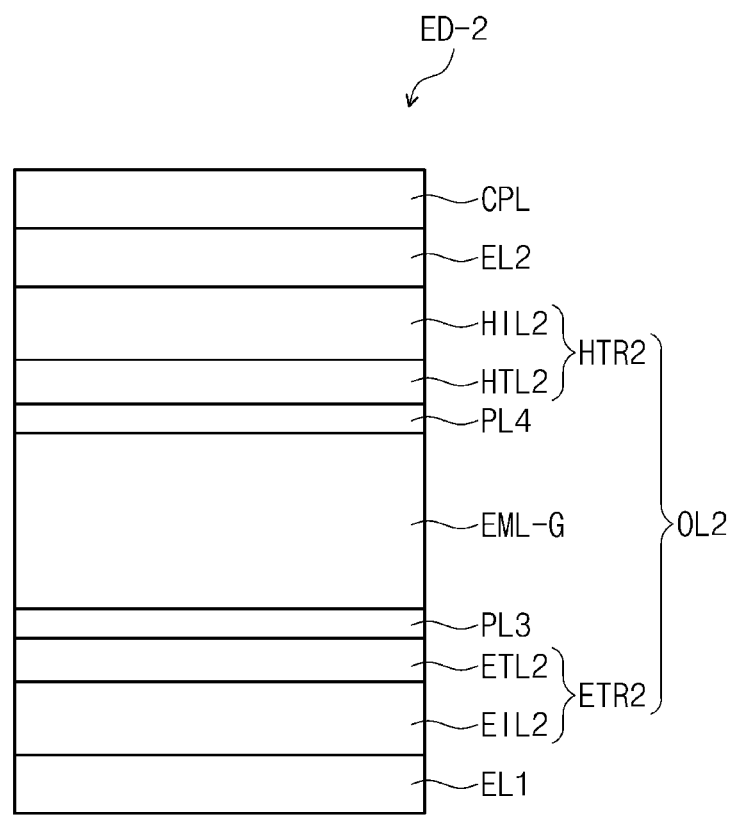

Compared to FIG. 7, FIG. 8 illustrates a schematic cross-sectional view of a light emitting element ED-2 of an embodiment in which a second electron transport region ETR2 includes a second electron injection layer EIL2 and a second electron transport layer ETL2, and a second hole transport region HTR2 includes a second hole injection layer HIL2 and a second hole transport layer HTL2. Compared to FIG. 7, FIG. 9 illustrates a schematic cross-sectional view of a light emitting element ED-2 of an embodiment further including a capping layer CPL disposed on the second electrode EL2. The embodiments are not limited thereto. For example, the second electron transport region ETR2 may further include a hole blocking layer (not shown) as a sub-organic layer, and the second hole transport region HTR2 may further include an electron blocking layer (not shown) as a sub-organic layer.

Figure 10:
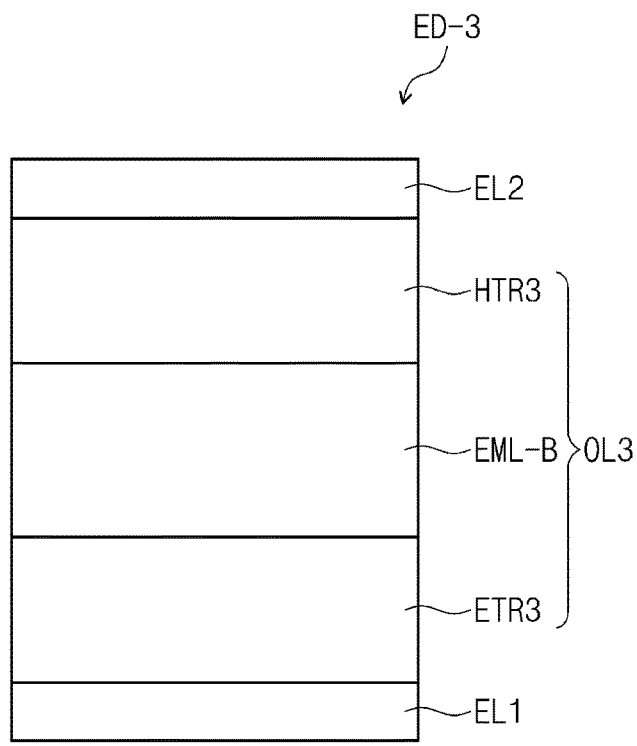

Referring to FIG. 10, a light emitting element ED-3 according to an embodiment includes: a first electrode EL1; a second electrode EL2 facing the first electrode EL1; a third emission layer EML-B disposed between the first electrode EL1 and the second electrode EL2; a third electron transport region ETR3 disposed between the first electrode EL1 and the second emission layer EML-G; and a third hole transport region HTR3 disposed between the third emission layer EML-B and the second electrode EL2.

Figure 11:
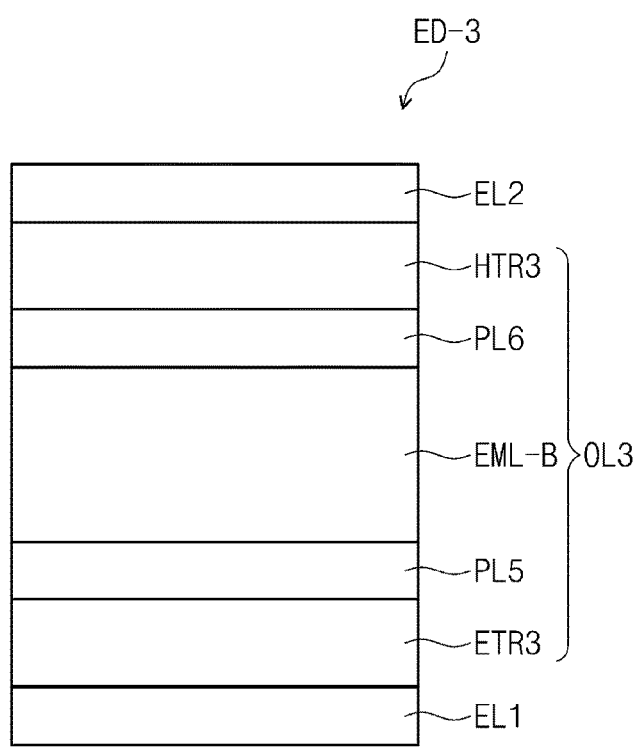

Referring to FIG. 11, a light emitting element ED-3 of an embodiment may further include a fifth auxiliary layer PL5 and a sixth auxiliary layer PL6. The fifth auxiliary layer PL5 may be disposed between the third emission layer EML-B and the third electron transport region ETR3, and the sixth auxiliary layer PL6 may be disposed between the third emission layer EML-B and the third hole transport region HTR3. The fifth auxiliary layer PL5 and the sixth auxiliary layer PL6 are disposed to contact the third emission layer EML-B.

Figure 12:
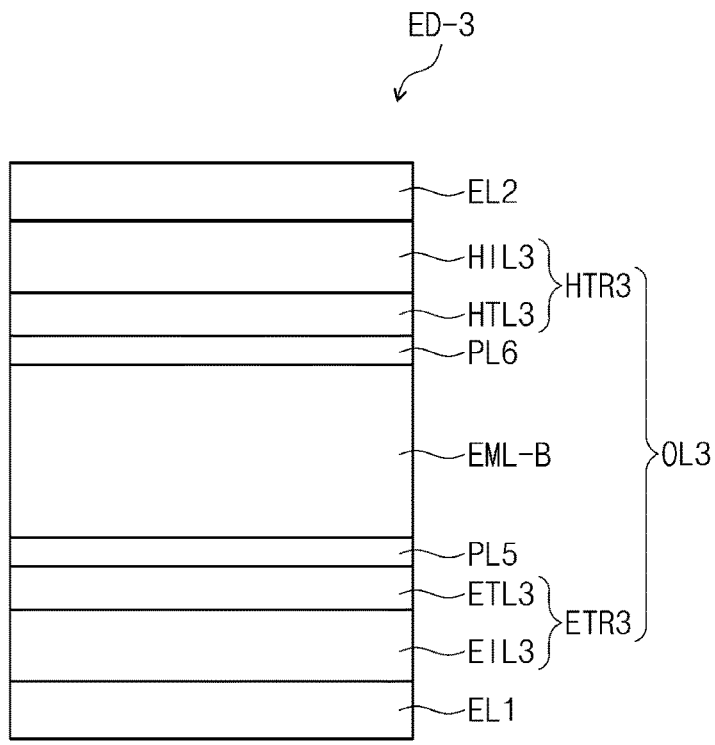
Figure 13:
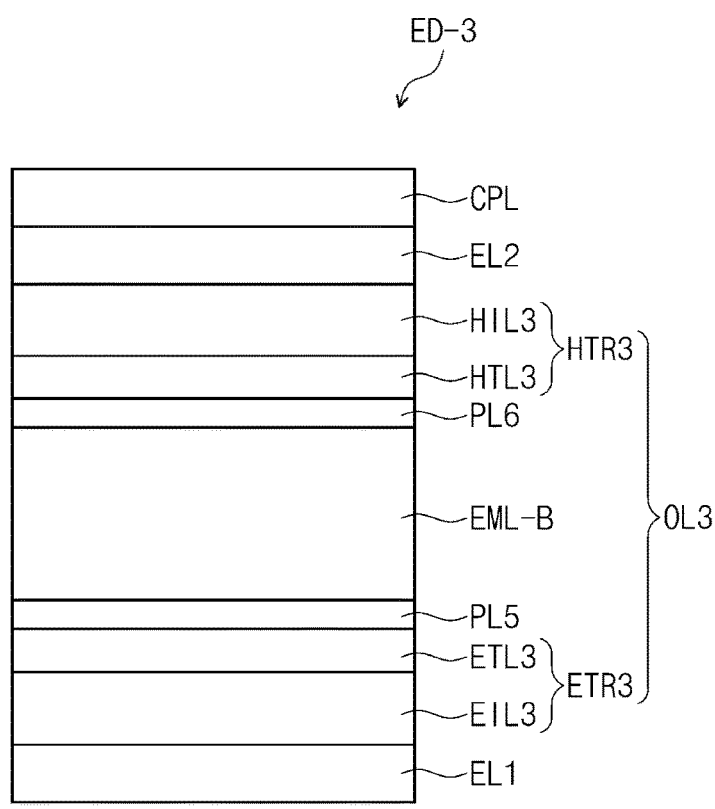

Compared to FIG. 11, FIG. 12 illustrates a schematic cross-sectional view of a light emitting element ED-3 of an embodiment in which a third electron transport region ETR3 includes a third electron injection layer EIL3 and a third electron transport layer ETL3, and a third hole transport region HTR3 includes a third hole injection layer HIL3 and a third hole transport layer HTL3. In addition, compared to FIG. 11, FIG. 13 illustrates a schematic cross-sectional view of a light emitting element ED-3 of an embodiment further including a capping layer CPL disposed on the second electrode EL2. The embodiments are not limited thereto. For example, the third electron transport region ETR3 may further include a hole blocking layer (not shown) as a sub-organic layer, and the third hole transport region HTR3 may further include an electron blocking layer (not shown) as a sub-organic layer.

In an embodiment, each of the first to sixth auxiliary layer PL1, PL2, PL3, PL4, PL5, and PL6 may independently have a thickness of about 10 nm to about 30 nm.

The first auxiliary layer PL1, the third auxiliary layer PL3, and the fifth auxiliary layer may include the same material or different materials. The second auxiliary layer PL2, the fourth auxiliary layer PL4, and the sixth auxiliary layer PL6 may include the same material or different materials. The first auxiliary layer PL1, the third auxiliary layer PL3, and the fifth auxiliary layer PL5 may have the same thickness or different thicknesses. The second auxiliary layer PL2, the fourth auxiliary layer PL4, and the sixth auxiliary layer PL6 may have the same thickness or different thicknesses. Each material and thickness of the first auxiliary layer PL1 and the second auxiliary layer PL2 may vary depending on a material included in the first emission layer EML-R. Each material and thickness of the third auxiliary layer PL3 and the fourth auxiliary layer PL4 may vary depending on a material included in the second emission layer EML-G. Each material and thickness of the fifth auxiliary layer PL5 and the sixth auxiliary layer PL6 may vary depending on a material included in the third emission layer EML-B.

Each of the first auxiliary layer PL1, the third auxiliary layer PL3, and the fifth auxiliary layer PL5 may independently include an electron transport material, and each of the second auxiliary layer PL2, the fourth auxiliary layer PL4, and the sixth auxiliary layer PL6 may independently include a hole transport material.

In the light emitting elements ED-1, ED-2, and ED-3 according to an embodiment, the first electrode EL1 has conductivity. The first electrode EL1 may be formed of a metal material, a metal alloy, or a conductive compound. The first electrode EL1 may be an anode or a cathode. However, the embodiments are not limited thereto. The first electrode EL1 may be a pixel electrode.

In the light emitting elements ED-1, ED-2, and ED-3 according to an embodiment, the first electrode EL1 may be a reflective electrode. For example, the first electrode EL1 may include Ag, Mg, Cu, Al, Pt, Pd, Au, Ni, Nd, Ir, Cr, Li, Ca, LiF/Ca, LiF/Al, Mo, Ti, W, or a compound or mixture thereof (e.g., a mixture of Ag and Mg) with the high reflectivity. The first electrode EL1 may have a multilayer structure including a reflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a two-layer structure of ITO/Ag and a three-layer structure of ITO/Ag/ITO, but the embodiments are not limited thereto. For example, the first electrode EL1 may include the above-described metal materials, combinations of at least two metal materials of the above-described metal materials, oxides of the above-described metal materials, or the like. The thickness of the first electrode EL1 may be from about 700 Å to about 10,000 Å. For example, the thickness of the first electrode EL1 may be from about 1,000 Å to about 3,000 Å.

The electron transport regions ETR1, ETR2, and ETR3 are disposed on the first electrode EL1. The electron transport regions ETR1, ETR2, and ETR3 may have a single layer formed of a single material, a single layer formed of different materials, or a multilayer structure having layers formed of different materials.

For example, the electron transport regions ETR1, ETR2, and ETR3 may have a single layer structure of electron injection layers EIL1, EIL2, and EIL3 or electron transport layers ETL1, ETL2, and ETL3, and may have a single layer structure formed of an electron injection material and an electron transport material. The first electron transport region ETR1 may have a single layer structure formed of different materials. The first electron transport region ETR1 may have a structure in which a first electron injection layer EIL1 and a first electron transport layer ETL1 are stacked each other, or may have a structure in which a first electron injection layer EIL1, a first electron transport layer ETL1, and a first hole blocking layer (not shown) are stacked each other. The second electron transport region ETR2 may have a structure in which a second electron injection layer EIL2 and a second electron transport layer ETL2 are stacked each other, or may have a structure in which a second electron injection layer EIL2, a second electron transport layer ETL2 and a second hole blocking layer (not shown) are stacked each other. The third electron transport region ETR3 may have a structure in which a third electron injection layer EIL3 and a third electron transport layer ETL3 are stacked each other, or may have a structure in which a third electron injection layer EIL3, third electron transport layer ETL3 and a third hole blocking layer (not shown) are stacked each other. However, the embodiments are not limited thereto.

The electron transport regions ETR1, ETR2 and ETR3 may have, for example, a thickness of about 1,000 Å to about 1,500 Å.

The electron transport regions ETR1, ETR2, and ETR3 may be formed using various methods such as a vacuum deposition method, a spin coating method, a cast method, a Langmuir-Blodgett (LB) method, an inkjet printing method, a laser printing method, a laser induced thermal imaging (LITI) method, etc.

The electron transport regions ETR1, ETR2, and ETR3 may include an anthracene-based compound. However, the embodiments are not limited thereto, and the electron transport regions ETR1, ETR2, and ETR3 may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and a mixture thereof.

The electron transport regions ETR1, ETR2, and ETR3 may include a metal halide such as LiF, NaCl, CsF, RbCl, RbI, CuI, and KI, a lanthanide metal such as Yb, and a co-deposited material of the metal halide and the lanthanide metal. For example, the electron transport regions ETR1, ETR2, and ETR3 may include KI:Yb, RbI:Yb, etc. as a co-deposited material. The electron transport regions ETR1, ETR2, and ETR3 may be formed using a metal oxide such as $Li_2O$ and BaO, or 8-hydroxyl-lithium quinolate (Liq), etc., but the embodiments are not limited thereto. The electron transport regions ETR1, ETR2, and ETR3 may also be formed of a mixture material of an electron transport material and an insulating organometallic salt. The organometallic salt may be a material having an energy band gap of about 4 eV or more. Specifically, the organometallic salt may include, for example, metal acetates, metal benzoates, metal acetoacetates, metal acetylacetonates or metal stearates.

The electron transport regions ETR1, ETR2, and ETR3 may further include at least one of 2,9-dimethyl-4,7-diphenyl-1,10-phenanthroline (BCP), or 4,7-diphenyl-1,10-phenanthroline (Bphen) in addition to the above-described materials, but the embodiments are not limited thereto.

The electron transport regions ETR1, ETR2, and ETR3 may include the above-described compounds of the electron transport region in at least one of the electron injection layers EIL1, EIL2, and EIL3, the electron transport layers ETL1, ETL2, and ETL3, or the hole blocking layer (not shown).

In case that the electron transport regions ETR1, ETR2, and ETR3 include the electron transport layers ETL1, ETL2, and ETL3, the electron transport layers ETL1, ETL2, and ETL3 may have a thickness of about 100 Å to about 1,000

Å, for example, about 150 Å to about 500 Å. If the thicknesses of the electron transport layers ETL1, ETL2, and ETL3 satisfy the above-described range, satisfactory electron transport properties may be obtained without a substantial increase in driving voltage. In case that the electron transport regions ETR1, ETR2, and ETR3 include the electron injection layers EIL1, EIL2, and EIL3, the electron injection layers EIL1, ETL2, and ETL3 may have a thickness of about 1 Å to about 100 Å, for example, about 3 Å to about 90 Å. If the thicknesses of the electron injection layers EIL1, EIL2, and EIL3 satisfy the above-described range, satisfactory electron injection properties may be obtained without a substantial increase in driving voltage.

The emission layers EML-R, EML-G, and EML-B is provided on the electron transport regions ETR1, ETR2, and ETR3. In the first light emitting element ED-1, the first auxiliary layer PL1 is disposed between the first electron transport region ETR1 and the first emission layer EML-R. In the second light emitting element ED-2, the third auxiliary layer PL3 is disposed between the second electron transport region ETR2 and the second emission layer EML-G. In the second light emitting element ED-3, the fifth auxiliary layer PL5 may be disposed between the third electron transport region ETR3 and the third emission layer EML-B.

The emission layers EML-R, EML-G, and EML-B may have, for example, a thickness of about 100 Å to about 1,000 Å, for example, about 100 Å to about 300 Å. The emission layers EML-R, EML-G, and EML-B may have a single layer formed of a single material, a single layer formed of different materials, or a multilayer structure having layers formed of different materials.

In the light emitting elements ED-1, ED-2, ED-3 of an embodiment, the emission layers EML-R, EML-G, and EML-B may include anthracene derivatives, pyrene derivatives, fluoranthene derivatives, chrysene derivatives, dehydrobenzanthracene derivatives, or triphenylene derivatives. The emission layers EML-R, EML-G, and EML-B may include anthracene derivatives or pyrene derivatives.

The emission layers EML-R, EML-G, and EML-B may also include general material, for example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b, d]furan (PPF), 4,4',4"-tris(carbazol-9-yl)-triphenylamine (TCTA), or 1,3,5-tris(1-phenyl-1H-benzo[d]imidazole-2-yl) benzene (TPBi). However, the embodiments are not limited thereto, for example, tris(8-hydroxyquinolino)aluminum ($Alq_3$), poly(N-vinylcarbazole) (PVK), 9,10-di(naphthalene-2-yl)anthracene (ADN), 3-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as a host material.

In an embodiment, the emission layers EML-R, EML-G, and EML-B may include styryl derivatives (e.g., 1,4-bis[2-(3-N-ethylcarbazoryl)vinyl]benzene (BCzVB), 4-(di-p-tolylamino)-4'-[(di-p-tolylamino)styryl] stilbene (DPAVB), and N-(4-((E)-2-(6-((E)-4-(diphenylamino)styryl)naphthalen-2-yl)vinyl)phenyl)-N-phenylbenzena mine (N-BDAVBi), 4,4'-bis[2-(4-(N,N-diphenylamino)phenyl)vinyl]biphenyl (DPAVBi), perylene and the derivatives thereof (e.g., 2,5,8,11-tetra-t-butylperylene (TBP)), pyrene and the derivatives thereof (e.g., 1,1-dipyrene, 1,4-dipyrenylbenzene, 1,4-bis(N, N-diphenylamino)pyrene), etc.

The emission layers EML-R, EML-G, and EML-B may include phosphorescence dopant material, for example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescence dopant. Specifically, iridium(III) bis(4,6-difluorophenylpyridinato-N,C2')picolinate (FIrpic), bis(2,4-difluorophenylpyridinato)-tetrakis(1-pyrazolyl)borate iridium(III) (Fir6), or platinum octaethyl porphyrin (PtOEP) may be used as a phosphorescence dopant. However, the embodiments are not limited thereto.

The first light emitting element ED-1 according to an embodiment may include the first emission layer EML-R, the second light emitting element ED-2 may include the second emission layer EML-G, and the third light emitting element ED-3 may include the third emission layer EML-B. In the embodiment, the first emission layer EML-R is disposed between the first auxiliary layer PL1 and the second auxiliary layer PL2, and the second emission layer EML-G is disposed between the third auxiliary layer PL3 and the fourth auxiliary layer PL4. The third emission layer EML-B is disposed between the third electron transport region ETR3 and the third hole transport region HTR3. If the auxiliary layers PL5 and PL6 is provided for the third light emitting element ED-3, the third emission layer EML-B of the third light emitting element ED-3 may be disposed between the fifth auxiliary layer PL5 and the sixth auxiliary layer PL6.

The first emission layer EML-R emits first light. The second emission layer EML-G emits second light. The third emission layer EML-B emits third light. In the light emitting elements ED-1, ED-2, and ED-3 according to an embodiment, the first to third light may be different each other in wavelength range. For example, the first light may be red light having a wavelength range of about 625 nm to about 675 nm. For example, the second light may be green light having a wavelength range of about 500 nm to about 570 nm. For example, the third light may be blue light having a wavelength range of about 410 nm to about 480 nm.

In the light emitting elements ED-1, ED-2, and ED-3 of an embodiment, the hole transport regions HTR1, HTR2, and HTR3 are provided on the emission layers EML-R, EML-G, and EML-B, respectively. In the first light emitting element ED-1, the second auxiliary layer PL2 is disposed between the first hole transport region HTR1 and the first emission layer EML-R. In the second light emitting element ED-2, the fourth auxiliary layer PL4 is disposed between the second hole transport region HTR2 and the second emission layer EML-G. If the auxiliary layers PL5 and PL6 are provided for the third light emitting element ED, the sixth auxiliary layer PL6 may be disposed between the third hole transport region HTR3 and the third emission layer EML-B.

The hole transport regions HTR1, HTR2, and HTR3 may include at least one of the hole injection layers HILL HIL2, and HIL3, the hole transport layers HTL1, HTL2, and HTL3, a buffer layer or an emission-auxiliary layer (not shown), or an electron blocking layer (not shown). The hole transport regions HTR1, HTR2, and HTR3 may have, for example, a thickness of about 50 Å to about 15,000 Å.

The hole transport regions HTR1, HTR2, and HTR3 may have a single layer formed of a single material, a single layer formed of different materials, or a multilayer structure having layers formed of different materials.

For example, the hole transport regions HTR1, HTR2, and HTR3 may have a single layer structure of hole injection layers HIL1 HIL2, and HIL3 or hole transport layers HTL1, HTL2, and HTL3, and may have a single layer structure formed of a hole injection material and a hole transport material. The hole transport regions HTR1, HTR2, and HTR3 may have a single layer structure formed of different materials. The first hole transport region HTR1 may have a structure in which a first hole transport layer HTL1 and a first hole injection layer HIL1 are stacked each other, or may have a structure in which a first electron blocking layer (not shown), a first hole transport layer HTL1, and a first hole injection layer HIL1 are stacked each other. The second hole transport region HTR2 may have a structure in which a second hole transport layer HTL2 and a second hole injection layer HIL2 are stacked each other, or may have a structure in which a second electron blocking layer (not shown), a second hole transport layer HTL2, and a second hole injection layer HIL2 are stacked each other. The third hole transport region HTR3 may have a structure in which a third hole transport layer HTL3 and a third hole injection layer HTL3 are stacked each other, or may have a structure in which a third electron blocking layer (not shown), a third hole transport layer HTL3, and a third hole injection layer HIL3 are stacked each other. However, the embodiments are not limited thereto.

The hole transport regions HTR1, HTR2, and HTR3 may be formed using various methods such as a vacuum deposition method, a spin coating method, a cast method, a Langmuir-Blodgett (LB) method, an inkjet printing method, a laser printing method, a laser induced thermal imaging (LITI) method, etc.

The hole transport regions HTR1, HTR2, and HTR3 may include, for example, a phthalocyanine compound such as copper phthalocyanine; $N^1,N^{1'}$-([1,1'-biphenyl]-4,4'-diyl)bis ($N^1$-phenyl-$N^4,N^4$-di-m-tolylbenzene-1,4-diamine) (DNTPD), 4,4',4"-[tris(3-methylphenyl)phenylamino]triphenylamine] (m-MTDATA), 4,4',4"-tris(N,N-diphenylamino) triphenylamine (TDATA), 4,4',4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), tri phenyl amine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3, 6,7,10,11-hexacarbonitrile (HATCN), etc.

The hole transport regions HTR1, HTR2, and HTR3 may include, for example, carbazole derivatives such as N-phenyl carbazole and polyvinyl carbazole, fluorene derivatives, N,N'-bis(3-methylphenyl)-N,N-diphenyl-[1,1-biphenyl]-4, 4'-diamine (TPD), triphenylamine derivatives such as 4,4', 4"-tris(N-carbazolyl)triphenylamine (TCTA), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

In addition, the hole transport regions HTR1, HTR2, and HTR3 may include 9-(4-tert-Butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1, 8-dimethyl-9H-carbazol-9-yl)benzene (mDCP), etc.

The hole transport regions HTR1, HTR2, and HTR3 may include the above-described compounds of the hole transport region in at least one of the hole injection layers HIL1 HIL2, and HIL3, the hole transport layers HTL1, HT2L, and HTL3, or the electron blocking layer (not shown).

The hole transport regions HTR1, HTR2, and HTR3 may have a thickness of about 100 Å to about 10,000 Å, for example, about 100 Å to about 5,000 Å. In case that the hole transport regions HTR1, HTR2, and HTR3 include the hole injection layers HIL1 HIL2, and HIL3, the hole injection layers HIL1 ETL2, and ETL3 may have, for example, a thickness of about 30 Å to about 1,000 Å. In case that the hole transport regions HTR1, HTR2, and HTR3 include the hole transport layers HTL1, HTL2, and HTL3, the hole transport layers HTL1, HTL2, and HTL3 may have a thickness of about 30 Å to about 1,000 Å. For example, in case that the hole transport regions HTR1, HTR2, and HTR3 include the electron blocking layer (not shown), the electron blocking layer (not shown) may have a thickness of about 10 Å to about 1,000 Å. If the thicknesses of the hole transport regions HTR1, HTR2, and HTR3, the hole injection layers HIL1 HIL2, and HIL3, and the electron blocking layer (not shown) satisfy the above-described ranges, satisfactory hole transport properties may be achieved without a substantial increase in driving voltage.

The hole transport regions HTR1, HTR2, and HTR3 may further include, in addition to the above-described materials, a charge generating material to increase conductivity. The charge generating material may be dispersed uniformly or non-uniformly in the hole transport regions HTR1, HTR2, and HTR3. The charge generating material may be, for example, a p-dopant. The p-dopant may include at least one of a halogenated metal compound, a quinone derivative, a metal oxide, or a cyano group-containing compound, but the embodiments are not limited thereto. For example, the p-dopant may include a quinone derivative such as tetracyanoquinodimethane (TCNQ) and 2,3,5,6-tetrafluoro-7,7', 8,8'-tetracyanoquinodimethane (F4-TCNQ), a metal oxide such as a tungsten oxide and a molybdenum oxide, etc., but the embodiments are not limited thereto.

As described above, the hole transport regions HTR1, HTR2, and HTR3 may include at least one of the buffer layer (not shown) or the electron blocking layer (not shown) in addition to the hole transport layers HTL1, HTL2, and HTL3 and hole injection layers HIL1 HIL2, and HIL3. The buffer layer (not shown) may compensate a resonance distance according to the wavelength of light emitted from the emission layer EML and may thus increase light emission efficiency. The buffer layer (not shown) may include materials included in the hole transport regions HTR1, HTR2, and HTR3. The electron blocking layer (not shown) is a layer that serves to prevent electrons from being injected from the electron transport regions ETR1, ETR2, and ETR3 into the hole transport regions HTR1, HTR2, and HTR3.

The second electrode EL2 is provided on the hole transport regions HTR1, HTR2, and HTR3. The second electrode EL2 may be a common electrode. The second electrode EL2 may be a cathode or an anode, but the embodiments are not limited thereto. For example, in case that the first electrode EL1 is an anode, the second electrode EL2 may be a cathode, and in case that the first electrode EL1 is a cathode, the second electrode EL2 may be an anode.

The second electrode EL2 may be a transflective electrode or a transmissive electrode. In case that the second electrode EL2 is a transmissive electrode, the second electrode EL2 may be formed of, for example, ITO, IZO, ZnO, ITZO, etc.

In case that the second electrode EL2 is a transflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or mixture thereof (e.g., AgMg, AgYb, or MgAg). The second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, or the like.

Although not shown, the second electrode EL2 may be connected with an auxiliary electrode. If the second electrode EL2 is connected with the auxiliary electrode, the resistance of the second electrode EL2 may decrease.

The light emitting elements ED-1, ED-2, and ED-3 according to an embodiment include the auxiliary layers PL1, PL2, PL3, PL4, PL5, and PL6. In the embodiment, the first auxiliary layer PL1 is disposed between the first electron transport region ETR1 and the first emission layer EML-R, and the second auxiliary layer PL2 is disposed between the first hole transport region HTR1 and the first emission layer EML-R. The third auxiliary layer PL3 is disposed between the second electron transport region ETR2 and the second emission layer EML-R, and the fourth auxiliary layer PL4 is disposed between the second hole transport region HTR2 and the second emission layer EML-R. The fifth auxiliary layer PL5 is disposed between the third electron transport region ETR3 and the third emission layer EML-B, and the sixth auxiliary layer PL6 is disposed between the third hole transport region HTR3 and the third emission layer EML-B.

The first auxiliary layer PL1, the third auxiliary layer PL3, and the fifth auxiliary layer PL5 may each independently include an electron transport material, and the second auxiliary layer PL2, the fourth auxiliary layer PL4, and the sixth auxiliary layer PL6 may each independently include a hole transport material.

According to an embodiment, the light emitting element ED-1, ED-2, and ED-3 may have an inverted element structure in which the electron transport region ETR is disposed below the emission layer EML and the hole transport region HTR is disposed above the emission layer EML, and an auxiliary layer PL1 to PL6 may be disposed in at least some of the light emitting elements to be adjacent to the emission layer. Accordingly, the light emitting position in the organic layer is optimized, and thus light emission characteristics of the light emitting element may be improved.

For example, the first light emitting element ED-1 includes the first auxiliary layer PL1 and the second auxiliary layer PL2 respectively disposed adjacent to the upper surface and the lower surface of the first emission layer EML-R, the second light emitting element ED-2 includes the third auxiliary layer PL3 and the fourth auxiliary layer PL4 respectively disposed adjacent to the upper surface and the lower surface of the second emission layer EML-G, and the third light emitting element ED-3 includes the fifth auxiliary layer PL5 and the sixth auxiliary layer PL6 respectively disposed adjacent to the upper surface and the lower surface of the third emission layer EML-B. Accordingly, the inverted element is introduced to implement a degradation prevention circuit, and thus the inverted element may be applied to the display device employing the NMOS transistor. In addition, since the light emitting position in the organic layer is optimized, a level of light emission characteristics similar to a forward light emitting element may be achieved. Therefore, a high-speed driving of the display device and improvement of luminous efficiency can be achieved.

A capping layer CPL may be disposed on the second electrode EL2 of the light emitting elements ED-1, ED-2, and ED-3 of an embodiment. The capping layer CPL may include a multilayer or a single layer.

In an embodiment, the capping layer CPL may be an organic layer or an inorganic layer. For example, in case that the capping layer CPL includes an inorganic material, the inorganic material may include an alkaline metal compound such as LiF, an alkaline earth metal compound such as $MgF_2$, SiON, $SiN_x$, SiOy, etc.

For example, in case that the capping layer CPL includes an organic material, the organic material may include α-NPD, NPB, TPD, m-MTDATA, $Alq_3$, CuPc, N4,N4,N4', N4'-tetra(biphenyl-4-yl)biphenyl-4,4'-diamine (TPD15), 4,4',4''-tris(carbazol sol-9-yl)triphenylamine (TCTA), etc., or an epoxy resin, or acrylate such as methacrylate. However, the embodiments are not limited thereto, and the capping layer CPL may include at least one of Compounds P1 to P5 below:

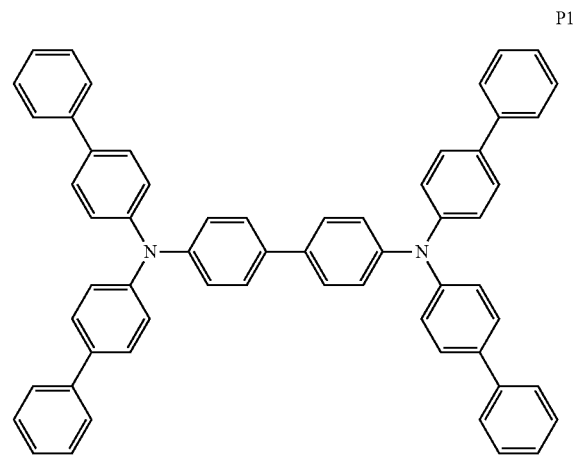

P1

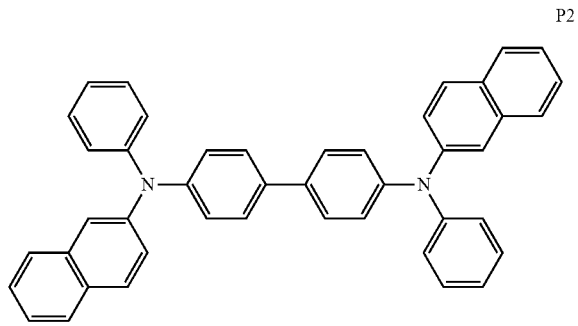

P2

-continued

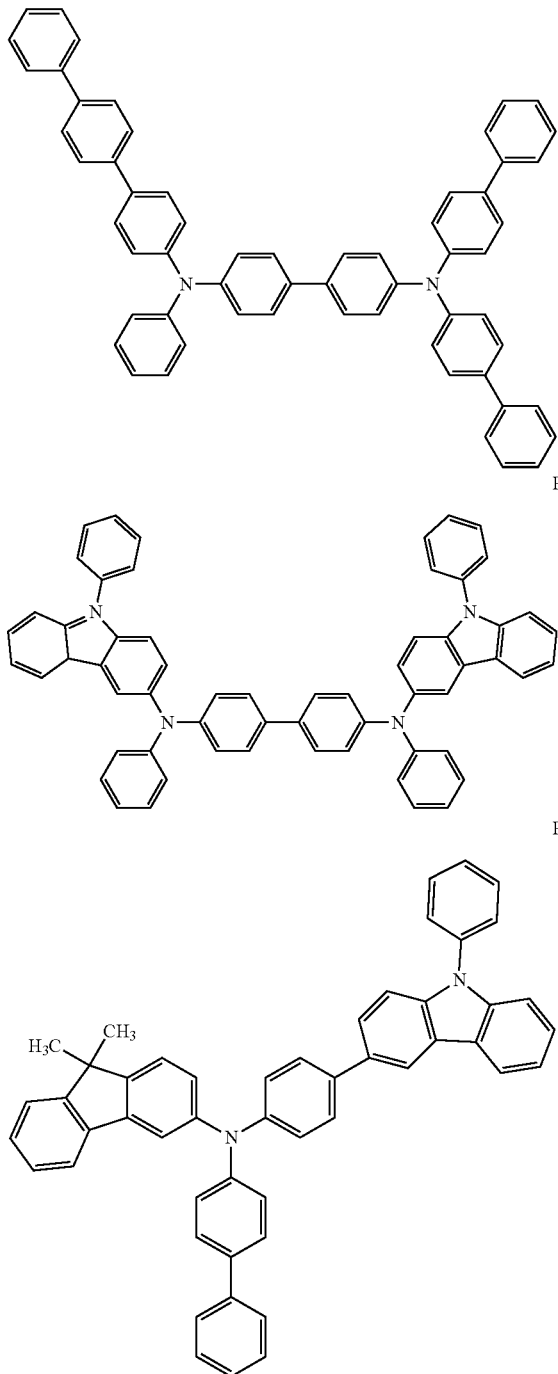

The refractive index of the capping layer CPL may be about 1.6 or more. For example, the refractive index of the capping layer CPL may be about 1.6 or more with respect to light having a wavelength about 550 nm to about 660 nm.

The light emitting elements ED-1, ED-2, and ED-3 according to an embodiment have the inverted element structure. As a voltage is applied to each of the first electrode EL1 and the second electrode EL2, the electrons injected from the first electrode EL1 move through the electron transport region ETR to the emission layer EML. The holes injected from the second electrode EL2 move through the hole transport region HTR to the emission layer EML. The electrons and holes are recombined in the emission layer EML to generate excitons and light is emitted when the excitons return to a ground state from an excited state. In the embodiment, each of the first light emitted from the first emission layer EML-R, the second light emitted from the second emission layer EML-G, and the third light emitted from the third emission layer EML-B may emit light having a substantially different wavelength.

The light emitting elements ED-1, ED-2, and ED-3 may have organic layers OL1, OL2, and OL3. Each of the organic layers OL1, OL2, and OL3 may include an emission layer EML-R, EML-G and EML-B, an electron transport region ETR, and a hole transport region HTR, and may further include auxiliary layers PL1 to PL6. The thickness of the first organic layer OL1 may be the same as an nth-order resonance distance in which the first light generated by the first emission layer EML-R is reflected on a reflective interface, i.e., the first electrode, to nth-resonate. According to an embodiment, n is an integer equal to or more than 2. For example, n may be 2. The thickness of the second organic layer OL2 may be the same as an nth-order resonance distance in which the second light generated by the second emission layer EML-G is reflected on the reflective interface to nth-resonate. The thickness of the third organic layer OL3 may be the same as an nth-order resonance distance in which the third light generated by the third emission layer EML-B is reflected on the reflective interface to n-th resonate.

The organic layers OL1, OL2, and OL3 may be defined within a distance from an upper surface of the first electrode EL1 to a lower surface of the second electrode EL2. The thickness of the first organic layer OL1 may have a thickness range of about 250 nm to about 290 nm. The thickness of the second organic layer OL2 may have a thickness range of about 210 nm to about 250 nm. The thickness of the third organic layer OL3 may have a thickness range of about 160 nm to about 200 nm. In the light emitting elements ED-1, ED-2, and ED-3 of an embodiment, in correspondence with a wavelength of the light generated in the emission layer of each light emitting element, the thicknesses of the organic layers are adjusted so that the light reflected at the first electrode interface may nth-resonate, thereby improving light efficiency of the display device including the light emitting elements. For example, at least some of the light emitting elements may include the auxiliary layer(s) disposed adjacent to the emission layer so that the thickness of the organic layer may be easily adjusted for the reflected light to n-th resonate, thereby improving light efficiency of the display device.

Figure 14:
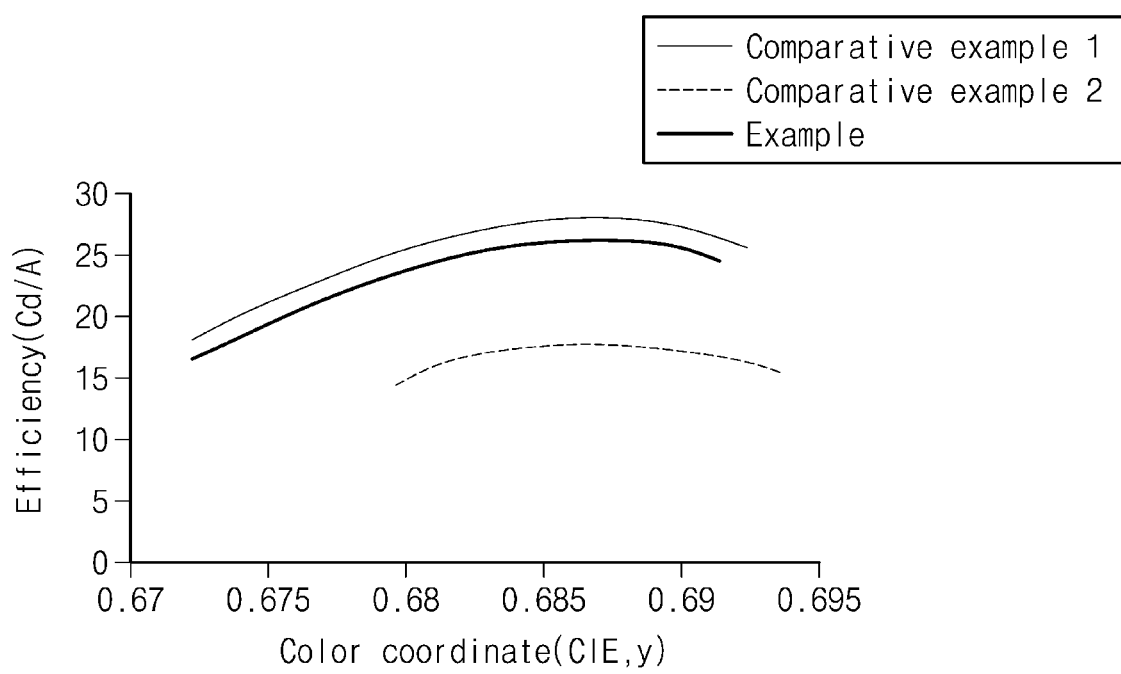
FIG. 14 is a graph illustrating, in comparison, efficiency characteristics in light emitting elements of Comparative Examples and Example.

FIG. 14 is a graph illustrating luminous efficiencies of Comparative Examples and Example. Example illustrates an evaluation result of the light emitting element according to an embodiment, and Comparative Examples 1 and 2 illustrate evaluation results of the light emitting elements having a layer structure different from Example. The constitutions of the other functional layers of the light emitting element of Comparative Examples and Example are same except for difference in layer structure of the light emitting element. Comparative Examples and Example correspond to the light emitting elements which emit red light having a center wavelength of about 625 nm to about 675 nm.

Comparative Example 1 includes the first electrode, the hole transport region, the emission layer, the electron transport region, and the second electrode, which are sequentially stacked unlike the light emitting element having the inverted structure. A graph of Comparative Example 1 corresponds to a luminous efficiency of the forward light emitting element. Comparative Example 2 has the inverted structure, and includes (or only includes) one auxiliary layer between the hole transport region and the emission layer.

Example has the inverted structure, and includes the first electrode, the electron transport region, the emission layer, the hole transport region, and the second electrode, which are sequentially stacked, and further includes the first auxiliary layer between the electron transport layer and the emission layer and the second auxiliary layer between the hole transport layer and the emission layer.

In FIG. 14, the horizontal axis is a color coordinate value which corresponds to a "y" value of the color coordinate of the light emitted from the light emitting element. The graph of FIG. 14 illustrates a luminous efficiency according to the color coordinate of the emitted light. Referring to the result of FIG. 14, it may be seen that efficiency of the light emitting element of Example is almost same as Comparative Example 1 within the range of about 0.68 to about 0.69 of the color coordinate value, and higher than Comparative Example 2.

The light emitting element of an example includes two auxiliary layers in order to optimize the light emitting position in the inverted structure, and has high light extraction effects, and thereby may have excellent light emission characteristics.

The light emitting element included in the display device according to an embodiment has the inverted element structure in which the electron transport region is disposed below the emission layer and the hole transport region is disposed above the emission layer, and includes an auxiliary layer disposed to be adjacent to the emission layer. Accordingly, the light emitting position in the organic layer is optimized, and thus light emission characteristics of the light emitting element may be improved.

Although the disclosure has been described with reference to the embodiments, it will be understood that the invention should not be limited to the embodiments but various changes and modifications can be made by those skilled in the art without departing from the spirit and scope of the invention.

Accordingly, the technical scope of the invention is not intended to be limited to the contents set forth in the detailed description of the specification, but is intended to be defined by the appended claims.

What is claimed is:

1. A display device comprising:
    a base layer, the base layer including a first emission region and a second emission region;
    a circuit layer disposed on the base layer and including a plurality of transistors;
    a first electrode disposed on the base layer;
    a second electrode disposed on the first electrode and facing the first electrode;
    a first organic layer disposed between the first electrode and the second electrode and disposed in the first emission region; and
    a second organic layer disposed between the first electrode and the second electrode and disposed in the second emission region, wherein
    the first organic layer comprises:
        a first electron transport layer disposed on the first electrode;
        a first auxiliary layer disposed on the first electron transport layer;
        a first emission layer disposed on the first auxiliary layer and emitting first light;
        a second auxiliary layer disposed on the first emission layer; and
        a first hole transport layer disposed on the second auxiliary layer, and
    the second organic layer comprises:
        a second electron transport layer disposed on the first electrode;
        a third auxiliary layer disposed on the second electron transport layer;
        a second emission layer disposed on the third auxiliary layer and emitting second light having a wavelength different from a wavelength of the first light;
        a fourth auxiliary layer disposed on the second emission layer; and
        a second hole transport layer disposed on the fourth auxiliary layer; and
        wherein each auxiliary layer includes a carrier transport layer, wherein
    the first electrode is a reflective electrode,
    the second electrode is a transflective electrode or a transmissive electrode, and
    the first light and the second light are emitted in a direction from the first electrode to the second electrode,
    the first electron transport layer is disposed closer to the circuit layer than the first hole transport layer in a direction perpendicular to an upper surface of the substrate,
    the second electron transport layer is disposed closer to the circuit layer than the second hole transport layer in a direction perpendicular to an upper surface of the substrate,
    at least one of the plurality of transistors is an NMOS transistor,
    the first electrode is electrically connected to the NMOS transistor,
    a thickness of the first organic layer is in a range of about 250 nm to about 290 nm,
    a thickness of the second organic layer is in a range of about 210 nm to about 250 nm,
    a thickness of the first auxiliary layer and a thickness of the third auxiliary layer are different from each other, and
    a thickness of the second auxiliary layer and a thickness of the fourth auxiliary layer are different from each other.

2. The display device of claim 1, wherein
    the first auxiliary layer and the third auxiliary layer include an electron transporting material, and
    the second auxiliary layer and the fourth auxiliary layer include a hole transporting material.

3. The display device of claim 1, wherein
    the center wavelength of the first light is in a range of about 625 nm to about 675 nm, and
    the center wavelength of the second light is in a range of about 500 nm to about 570 nm.

4. The display device of claim 1, wherein
    the first organic layer comprises a first electron injection layer disposed between the first electrode and the first electron transport layer, and
    the second organic layer comprises a second electron injection layer disposed between the first electrode and the second electron transport layer.

5. The display device of claim 1, wherein
    the first organic layer comprises a first hole injection layer disposed between the second electrode and the first hole transport layer, and the second organic layer comprises a second hole injection layer disposed between the second electrode and the second hole transport layer.

6. The display device of claim 1, further comprising a third organic layer disposed between the first electrode and the second electrode and disposed on a third emission region in the base layer, wherein the third organic layer comprises:
a third electron transport layer disposed on the first electrode;
a third emission layer disposed on the third electron transport layer and emitting third light; and
a third hole transport layer disposed on the third emission layer, and the thickness of the third organic layer is in a range of about 160 nm to about 200 nm.

7. The display device of claim 6, wherein the center wavelength of the third light is in a range of about 410 nm to about 480 nm.

8. The display device of claim 1, further comprising a capping layer disposed on the second electrode, wherein
the capping layer has a refractive index of about 1.6 or more.

9. The display device of claim 1, wherein
the first electron transport layer and the second electron transport layer are integral with each other, and
the first hole transport layer and the second hole transport layer are integral with each other.

10. The display device of claim 1, further comprising a pixel defining film disposed on the base layer, openings being defined in the pixel defining film corresponding to the first emission region and the second emission region, wherein at least a portion of each of the first electron transport layer, the second electron transport layer, the first hole transport layer, and the second hole transport layer is disposed on the pixel defining film.

11. The display device of claim 10, wherein
a first opening corresponding to the first emission region and a second opening corresponding to the second emission region are defined in the pixel defining film;
the first auxiliary layer, the first emission layer, and the second auxiliary layer are disposed in the first opening, and
the third auxiliary layer, the second emission layer, and the fourth auxiliary layer are disposed in the second opening.

12. The display device of claim 1, wherein
the first electrode is configured such that electrons are injected from the first electrode through the electron transport region to the emission layer, and
the second electrode is configured such that holes are injected from the second electrode through the hole transport region to the emission layer.

* * * * *